United States Patent
Bula et al.

(10) Patent No.: US 6,261,724 B1
(45) Date of Patent: Jul. 17, 2001

(54) METHOD OF MODIFYING A MICROCHIP LAYOUT DATA SET TO GENERATE A PREDICTED MASK PRINTED DATA SET

(75) Inventors: Orest Bula, Shelburne; Daniel C. Cole, Jericho; Edward W. Conrad, Jeffersonville; William C. Leipold, Enosburg Falls, all of VT (US); Donald J. Samuels, Silverthorne, CO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/334,367

(22) Filed: Jun. 16, 1999

(51) Int. Cl.[7] .............................. G03F 9/00; G06F 17/50; G21K 1/087
(52) U.S. Cl. ........................................... 430/5; 395/500.22
(58) Field of Search ................................. 430/5, 322, 323; 250/492.22; 395/500.22

(56) References Cited

U.S. PATENT DOCUMENTS

| | | | |
|---|---|---|---|
| 4,585,342 | 4/1986 | Lin et al. | 356/124 |
| 4,621,371 | 11/1986 | Gotou et al. | 378/34 |
| 5,308,991 | 5/1994 | Kaplan et al. | 250/492.22 |
| 5,402,224 | 3/1995 | Hirukawa et al. | 356/124 |
| 5,442,418 | 8/1995 | Murakami et al. | 355/53 |
| 5,721,074 | 2/1998 | Bae | 430/5 |
| 5,795,688 | * 3/2000 | Burdorf et al. | 430/5 |
| 5,804,340 | * 9/1998 | Garza et al. | 430/5 |
| 5,972,541 | * 10/1999 | Sugasawara et al. | 430/5 |
| 6,044,007 | * 3/2000 | Capodieci | 430/5 |
| 6,081,658 | * 6/2000 | Rieger et al. | 395/500.22 |

* cited by examiner

Primary Examiner—S. Rosasco
(74) Attorney, Agent, or Firm—Scully, Scott, Murphy & Presser; William D. Sabo

(57) ABSTRACT

A method is presented here that enables one to improve the prediction for the printed structures of circuit patterns in a microchip, thereby potentially aiding in the design of the microchip circuitry. This method comprises the steps of determining, by applying process bias and corner curvature rules to a real mask image, a simulated structure for the mask used in optical projection lithography; and determining, by applying optical and process proximity correction rules to said simulated mask structure, a more accurate prediction for the structures printed on the wafer. Preferably the simulated mask structure is determined by applying a symmetric bias consistent with a mask build process to the real mask image, adjusting predetermined features of the real mask image such as corners or narrow lines, and applying a reverse symmetric bias to the adjusted real mask image.

13 Claims, 5 Drawing Sheets

$Ri + Ro > L$

METHOD OF MODIFYING A MICROCHIP LAYOUT DATA SET TO GENERATE A PREDICTED MASK PRINTED DATA SET

FIELD OF THE INVENTION

This invention generally relates to designing reticles or masks that are used in optical projection lithography systems.

BACKGROUND OF THE INVENTION

Optical projection lithography systems are used to make large scale integrated circuits, or chips. A principal advantage of these systems is that they may be used to manufacture extremely fine patterns. Typically, masks or reticles are created that contain the pattern for a layer of material that will be used in the construction of a microchip. Light is projected through such a mask onto a photosensitive layer on a semiconductor wafer; further processing of the photosensitive material results in the pattern on the mask being transferred to the photosensitive film, which is then later used to create corresponding patterns by means such as etching, depositing, oxidizing or implanting materials on the semiconductor wafer.

Distortions and imperfections that exist within the optical projection mask, from the intended pattern, typically result in a lower quality pattern that is transferred to the photosensitive film on the wafer, and that is then transferred into the materials on the semiconductor wafer. The more distortions, the less likely the final resulting microchip circuitry will work properly, if at all.

Consequently, it is important that the mask be properly designed and manufactured. Because chip designs are usually pushing the limits of the small sizes of patterns that can be created on a chip, the process of transferring chip design shapes to a mask typically induces distortions in the'shapes as they appear on the mask. In particular, inner and outer corners are not only not square but have different radii of curvature. So-called resolution enhancements such as serifs commonly used for optical proximity correction may be badly distorted on the mask since they are typically smaller than the nominal minimum feature size for a given mask level. Hence, characterizing these distortions and taking them into account when designing a mask can significantly improve the quality of the mask that is created, thereby also potentially resulting in considerably improved printed patterns on the wafer. Since these effects may be important in determining the ultimate wafer level image, it is necessary to include them in the overall modeling strategy used to predict the printed shapes on a semiconductor wafer, given the design layout data.

SUMMARY OF THE INVENTION

An object of this invention is to improve methods for designing photolithography masks by improving the prediction of mask making features, thereby enabling the improvement of prediction of features that are created on semiconductor wafers.

Another object of the present invention is to design photolithography masks in a way that takes into account image foreshortening and corner rounding of the images on the mask.

These and other objects are attained with a method for predicting a "wafer image", meaning here, the printed pattern on a semiconductor wafer, given the intended design layout data for the pattern. This method comprises the steps of, first, determining, by applying process bias and corner curvature rules to the design layout for a mask, the creation of the predicted shape of the manufactured mask pattern. This mask pattern that is created will subsequently be referred to as the "mask image". Second, this simulated mask image will be used in conjunction with optical proximity correction rules and models to simulate and predict the patterns created either within the photoresist material, and/or within the subsequent materials on the semiconductor wafer. Hereafter, the patterns on the wafer will be referred to as the "wafer image".

By accurately taking into account the process used in the construction of the mask, and then by using simulation methods to predict the subsequent patterns created on the wafer by this mask, more accurate predictions will result of the final patterns created than if the mask making process is not taken into account. It is a key purpose of the present invention to provide this improved accuracy, and in a way that is fast, reliable, and does not incur undue computational resources. The proposed method will work well for stable and repeatable mask making processes, such as are conventionally used in semiconductor manufacturing. More specifically, corner rounding and mask biasing on optical projection masks are usually very evident and repeatable; including these characteristics into the design process is a key point of this patent. Preferably the simulated mask image is determined by applying a symmetric bias consistent with a mask build process to the Mask design data, adjusting predetermined features of the mask data such as corners or narrow lines, and applying a reverse symmetric bias to the adjusted mask design data.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
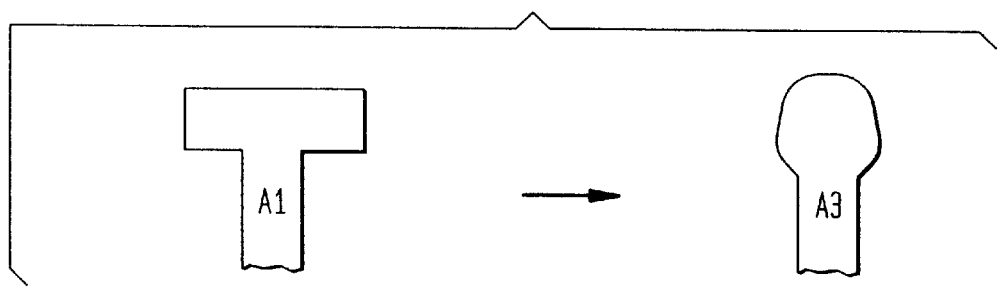
FIG. 1 illustrates the current art wherein wafer images are simulated from chip data.
Figure 2:
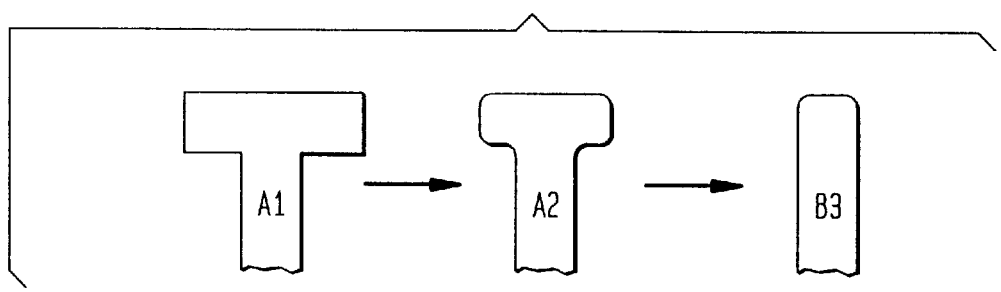
FIG. 2 illustrates a methodology for closely approximating the effects of mask image distortions on wafer level images.

FIG. 1 illustrates the current art wherein wafer images are simulated from chip data. Data image A1 produces wafer image A3, which is printed with considerable distortion from the intended printed result of B3 in FIG. 2. FIG. 2 illustrates a methodology for closely approximating the effects of masking image distortions on wafer level images. Data image A1 is adjusted according to the invention to produce mask image A2 which produces wafer image B3, namely, the desired printed result. Taking into account the actual mask shape, illustrated in FIG. 2, in a manner that is computationally fast and that does not incur undue computational burden and memory overhead, is the key issue here.

First a symmetric bias consistent with the mask build process is applied to the shapes. Then the corners are replaced with double bevels using empirically obtained beveling parameters. Then a reverse symmetric bias, which mimics the masking film etch bias, is applied. The resulting images closely approximate those found on actual masks. These images are then used as input to aerial modeling programs and/or other lithography simulation models, such as resist and etch bias models, to predict the shapes of the wafer level images.

Figure 3:
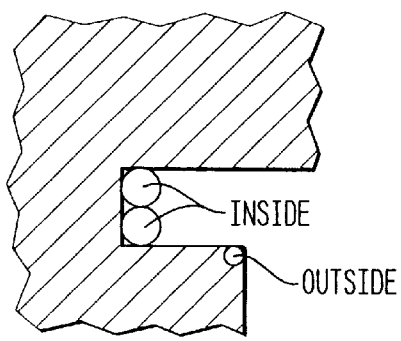
FIGS. 3–5 show examples of inside and outside corners of mask images.
Figure 4:
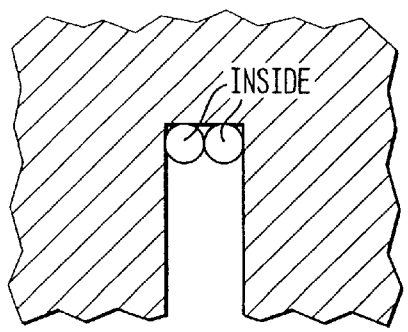
Figure 5:
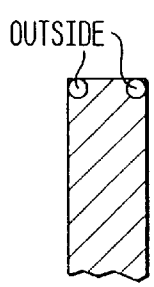

Two additional factors need to be considered. First, inside corners of mask images (corners surrounded on three sides by the masking film) typically have larger radii of curvature (or at least certainly different radii of curvature) than outside corners (corners surrounded on three sides by the absence of the masking film). The specific values for these radii are a function of the mask manufacturing process and are typically determined experimentally. FIGS. 3 through 5 provide examples. Second, if the mask images are sufficiently narrow so that the circles defined by the radii of curvature of neighboring corners of the same type (inside or outside) overlap, a different correction procedure is applied. Additionally, there may be orientation dependent effects which may need to be included.

The use of a double bevel adjustment of the data set is the preferred embodiment of this invention; however other embodiments could use bezier or cubic spline, parabolic or semicircular methodologies, as well as other related means for modeling the corner rounding effect observed in mask fabrication.

Figure 6:
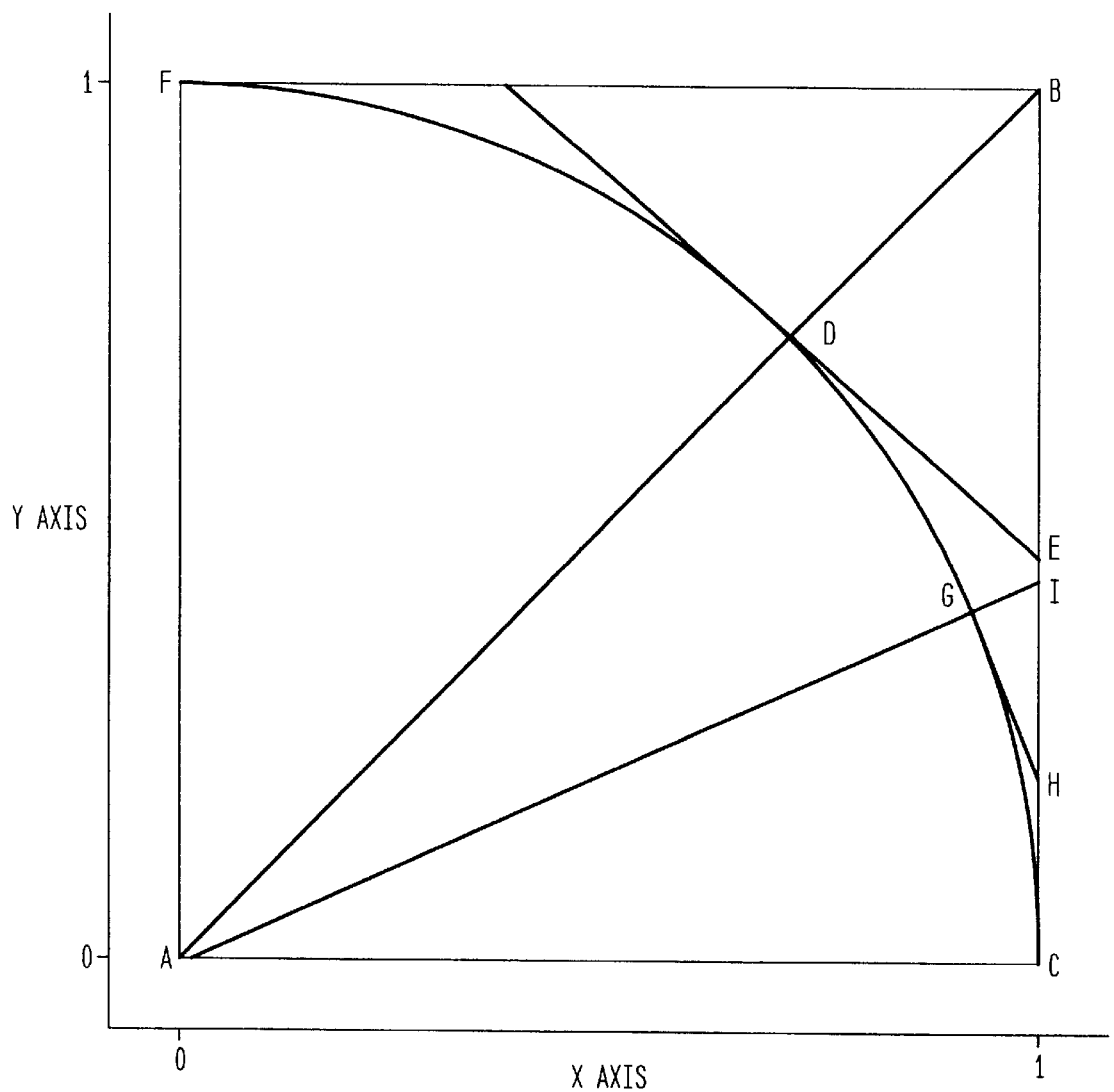
FIG. 6 shows a mask image corner inscribed with a quarter circle.

FIG. 6 shows an example of a corner of defined by $\overline{CBF}$ with an inscribed quarter circle $\overline{FDC}$ centered on point A. Lines $\overline{AF}, \overline{AD}, \overline{AG}$ and $\overline{AC}$ define radii of unit 1.0. For the first bevel, triangle $\overline{ABC}$ is an isosceles right triangle Therefore $\overline{AB}$, is equal to $\sqrt{2}$ times the radius. Therefore, $\overline{DB}$ is equal to $\sqrt{2}-1$. Therefore $\overline{BE}=\overline{DB}/\cos(45°)=0.58$. For the second bevel: $\overline{AG}$ is equal to the radius and bisects angle BAC. Angle $\overline{GAC}$ is 22.5°. Therefore $\overline{IC}$ tangent(22.5°)= 0.414, $\overline{IG}=1/\text{cosine}(22.5°)-1=0.082$, $\overline{IH}=\overline{IG}/\text{cosine}(67.5°)=0.215$, and $\overline{EH}=\overline{EC}-\overline{IC}+\overline{IH}=0.22$.

The first outside bevel side is equal to (the expected outside radius of curvature+mask process bias)×0.58. The second outside bevel side is equal to (the expected outside radius of curvature+mask process bias)×0.22. The first inside bevel side is equal to (the expected inside radius of curvature+mask process bias)×0.58. The second inside bevel side is equal to (the expected inside radius of curvature−mask process bias)×0.22.

Figure 7:
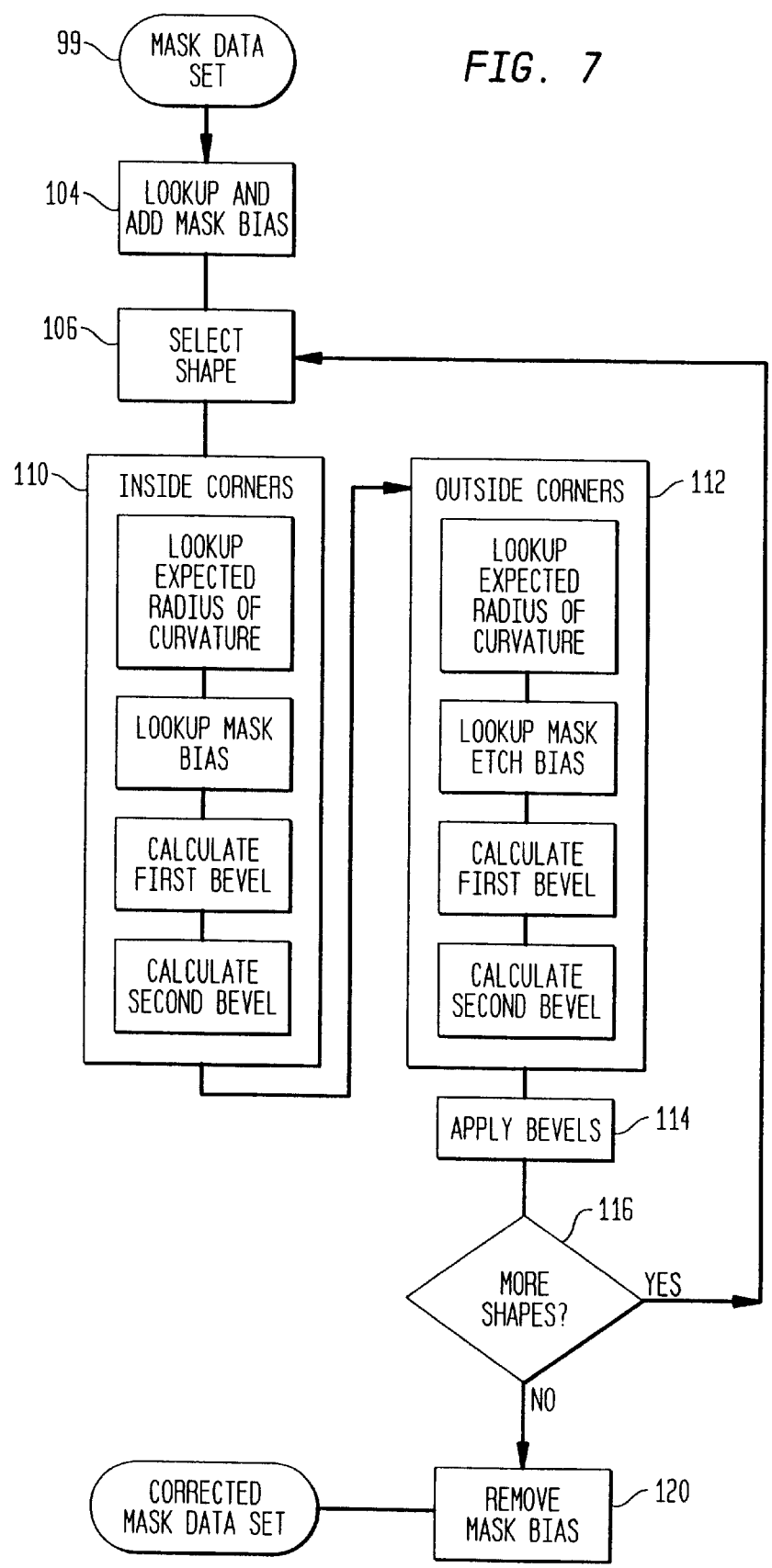
FIG. 7 is a flow chart of a method according to the present invention for isolated corner images.

FIG. 7 is a flowchart of the shapes adjustment rules of the invention for isolated corner images. The input is a mask data set of shapes 99. First, at steps 104 and 106, the mask process bias is added and a shape selected. Then at step 110, the amount of adjustment of inside corners is extracted from a lookup table, and then at step 112, the amount of adjustment of outside corners is extracted from a lookup table. Next at step 114, the adjustment is applied to the shape. The order in which these adjustments are determined and applied does not matter. If more shapes are to be corrected the process is repeated, as represented by step 116. The last step 120 is to subtract back the mask process bias and the result is a corrected mask data set.

The adjustment sub-process comprises looking up the expected radius of curvature for that shape based on measurements and the mask process bias for that technology and level, calculation of the first bevel and calculation of the second bevel according to the formula described above.

Figure 8:
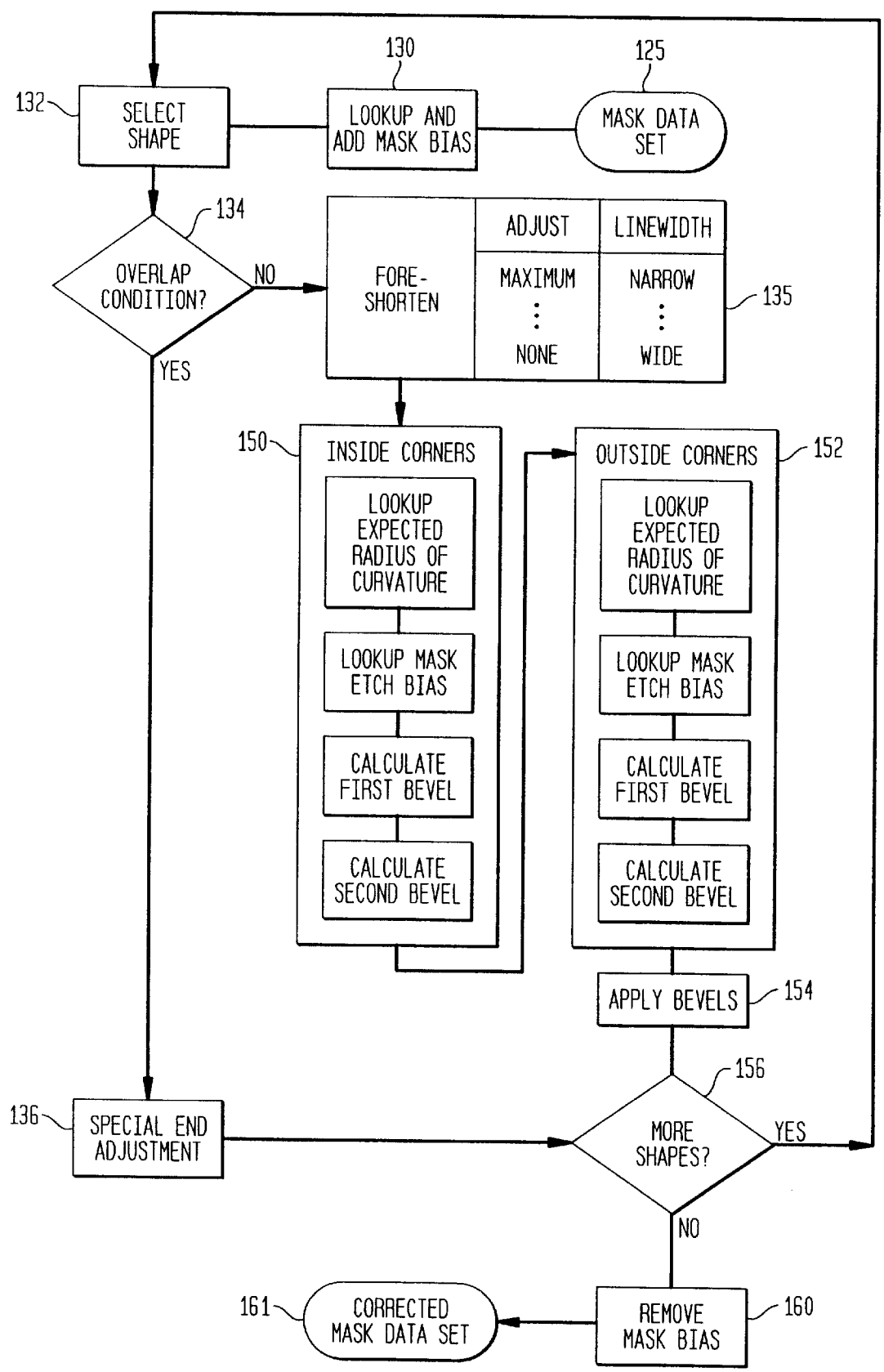
FIG. 8 is a flow chart of a method according to the invention for narrow lines.

FIG. 8 is a flowchart of the shapes adjustment rules of the invention for narrow lines. The input 125 is a mask data set of shapes. First the mask process bias 130 is added and a shape selected 132. Next a determination 134 is made of whether or not the shape is sufficiently narrow so that circles corresponding to the radius of curvature on neighboring inside or outside corners overlap.

Figure 11:
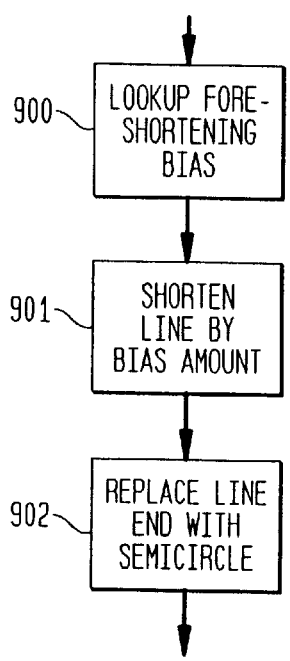
FIG. 11 is a flow chart showing a procedure that may be used with the mask image shape shown in FIG. 9.

If the circles do overlap, the procedure shown in FIG. 11 is applied to that portion of the shape, the standard procedure shown in FIG. 8 is applied to the rest of the shape, and the next shape is selected.

Figure 9:
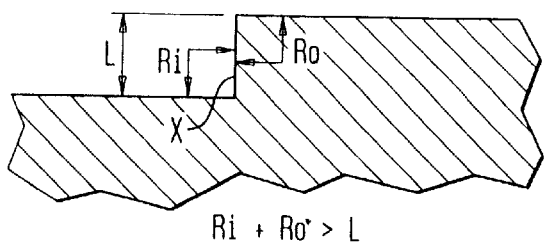
FIG. 9 shows a mask image having both inside and outside corners.
Figure 10:
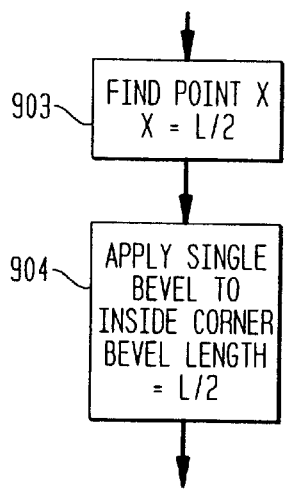
FIG. 10 shows a subroutine that may be used in the practice of this invention.

If an inside and an outside corner are sufficiently close so that their radii of curvature overlap as shown in FIG. 9, in normalized units, the point x is chosen to be L/2 when L is the separation of the inner and outer corners. Then the procedure shown in FIG. 10 is applied to that portion of the shape, the standard procedure shown in FIG. 8 is applied to the rest of the shape, and the next shape is selected.

In the special end adjustment process 136, narrow lines that have radii of curvature that overlap are treated as shown in FIG. 11. The lines are foreshortened by an amount 900 that depends on the line width and manufacturing process and is determined empirically. The line end is replaced with a semicircle 902. If an inside corner and an outside corner are sufficiently close so that their radii of curvature (e.g., Ri, Ro) overlap, as shown in FIG. 9, the point "x" is chosen to be one half of the separation (e.g., L/2) of the inner and outer corners. Then, as shown in FIG. 10 after the point "x" has been determined 903, a single bevel is applied to the inside corner where the bevel length is equal to L/2, 904.

For narrow lines that do not have radii of curvature that overlap, the width of the line is used to look up an appropriate foreshortening bias 135 that varies from a "maximum" value to "none" depending on the width of the line (which, again, is determined empirically for each mask level and mask manufacturing process). Then the line is shortened by the appropriate bias amount.

Referring again to FIG. 8, after the foreshortening process, for inside corners 150 the process includes looking up the expected radius of curvature for that shape (see inner flowchart within 150) based on measurements for that technology, level, and wafer process; looking up the mask etch bias (see iner flowchart within 150) for that technology, level, and mask process; calculating the first bevel and the second bevel, as shown in the flowchart section of 150, according to the formula described earlier.

After the foreshortening process, for outside corners 152 the process includes looking up the expected radius of curvature for that shape based on measurements for that technology, level, and mask process; looking up the mask etch bias for that technology, level, and mask process; calculating the first bevel and then the second bevel, according to the formula described earlier (see flowchart section in 152).

Next the adjustment is applied to the shape 154. If more shapes 156 are to be corrected the process is repeated. The last step is to subtract back the mask process bias 160 and the result is a corrected mask data set 161.

Thus, the final result is a corrected mask data set. The adjustment sub-process for corners which do not qualify for special treatment comprises lookup of the expected radius of curvature for that shape based on measurements for the mask manufacturing process, lookup of the mask process bias for the mask manufacturing process, calculation of the first bevel and calculation of the second bevel according to the formula described above.

While it is apparent that the invention herein disclosed is well calculated to fulfill the objects previously stated, it will be appreciated that numerous modifications and embodiments may be devised by those skilled in the art, and it is intended that the appended claims cover all such modifications and embodiments as fall within the true spirit and scope of the present invention. In particular, a specific means for taking account of mask bias and mask corner rounding has been described here. Other variations are also possible, but the key aim here is that via the use of modeling the mask fabrication process, one can incorporate these corrections into the design methodology, thereby resulting in improved chip design and improved microchip circuit operation.

Having thus described our invention, what we claim as new, and desire to secure by Letters Patent is:

1. A method for improving the predictability of physical properties or entities associated with the printed shapes in semiconductor manufacturing, the method comprising the steps of:
   providing a mask design for a given mask;
   applying bias and corner curvature rules to the mask design to yield simulated mask shapes that include mask distortions introduced into the given mask by mask making processing complexities; and
   using said simulated mask shapes as input to a wafer image simulator to yield predicted printed patterns on the wafer.

2. A method according to claim 1, wherein, the step of determining the simulated mask image includes the steps of
   applying a symmetric bias consistent with a mask build process to the real mask image;
   adjusting predetermined features of the real mask image; and
   applying a reverse symmetric bias to the adjusted real mask image.

3. A method according to claim 2, wherein the step of adjusting predetermined features of the real mask image includes the step of replacing corners of the real mask image.

4. A method according to claim 3, wherein the step of replacing corners of the real mask image includes the step of replacing corners of the real mask image with double bevels using empirically obtained beveling parameters.

5. A method of modifying a mask image data set to print a desired chip image, comprising the steps of:
   providing a mask image data set for a given mask;
   converting the mask image data to a simulated mask image, including simulated distortions introduced into the given mask by a mask making process;
   using the simulated mask image to further simulate a chip printed image; and
   making adjustments in the mask data set, on the basis of the simulated printed image, to print the desired chip image.

6. A method according to claim 5, wherein, the step of converting the mask image data includes the steps of
   applying a symmetric bias consistent with a mask build process to the mask image data;
   adjusting predetermined features of the mask image data; and
   applying a reverse symmetric bias to the adjusted mask image data.

7. A method of adjusting a set of mask data shapes having inside and outside corners, the method comprising the steps of:
   applying a mask process bias to the set of mask data shapes;
   fabricating a test mask from the set of test mask data shapes;
   characterizing distortions introduced into the test mask by the fabricating step, including
   determining a radius of curvature of inside corners of the test mask data shapes, and
   determining a radius of curvature of outside corners of the test mask data shapes;
   calculating an inside bevel edge for inside corners of the test mask data set using the determined radius of curvature of an inside corner and the mask process bias;
   calculating an outside bevel edge for outside corners of the test mask data set using the determined outside radius of curvature of an outside corner and the mask process bias;
   replacing the inside corners of the set of mask data shapes with the calculated inside bevel edge;
   replacing the outside corner with the calculated outside bevel edge; and
   removing the mask process bias from the set of mask data shapes.

8. A method according to claim 7, wherein the step of calculating an inside bevel edge includes the steps of calculating first and second inside bevel edges for the inside corner of the mask data set using the determined radius of curvature of the inside corner and the mask process bias.

9. A method according to claim 8, wherein the step of calculating first and second inside bevel edges includes the step of calculating the first inside bevel edge by multiplying the sum of the determined inside radius of curvature and said mask bias by a first preset value.

10. A method according to claim 9, wherein the step of calculating first and second inside bevel edges includes the step of calculating the second inside bevel edge by multiplying the sum of the determined inside radius of curvature and said mask bias by a second preset value.

11. A method according to claim 7, wherein the step of calculating an outside bevel edge includes the steps of calculating first and second outside bevel edges for the outside corner of the mask data set using the determined radius of curvature of the inside corner and the mask process bias.

12. A method according to claim 11, wherein the step of calculating first and second outside bevel edges includes the step of calculating the first outside bevel edge by multiplying the sum of the determined inside radius of curvature and said mask bias by a first preset value.

13. A method according to claim 12, wherein the step of calculating first and second outside bevel edges includes the step of calculating the second outside bevel edge by multiplying the sum of the determined inside radius of curvature and said mask bias by a second preset value.

* * * * *